United States Patent
Willis et al.

(10) Patent No.: US 8,898,845 B2
(45) Date of Patent: Dec. 2, 2014

(54) BRUSH MANDREL FOR PVA SPONGE BRUSH

(75) Inventors: Robert Willis, Diamond Springs, CA (US); Bradley S. Withers, El Dorado Hills, CA (US)

(73) Assignee: Llinois Tool Works, Inc., Glenview, IL (US)

( * ) Notice: Subject to any disclaimer, the term of this patent is extended or adjusted under 35 U.S.C. 154(b) by 153 days.

(21) Appl. No.: 13/464,810

(22) Filed: May 4, 2012

(65) Prior Publication Data

US 2012/0312322 A1 Dec. 13, 2012

Related U.S. Application Data

(63) Continuation-in-part of application No. 29/393,743, filed on Jun. 8, 2011.

(60) Provisional application No. 61/494,786, filed on Jun. 8, 2011.

(51) Int. Cl.
| | |
|---|---|
| H01L 21/00 | (2006.01) |
| B08B 1/04 | (2006.01) |
| H01L 21/67 | (2006.01) |
| A46B 13/00 | (2006.01) |

(52) U.S. Cl.
CPC ............. B08B 1/04 (2013.01); *H01L 21/67046* (2013.01); *A46B 13/001* (2013.01)
USPC .................................. 15/102; 15/179; 15/230

(58) Field of Classification Search
CPC ... A46B 13/001; B08B 1/04; H01L 21/67046
USPC ........................................... 15/102, 179, 230
See application file for complete search history.

(56) References Cited

U.S. PATENT DOCUMENTS

| | | |
|---|---|---|
| 6,502,273 B1 | 1/2003 | Mihara et al. |
| D622,920 S | 8/2010 | Bejtlich, III |

(Continued)

FOREIGN PATENT DOCUMENTS

| | | |
|---|---|---|
| CN | 1913801 A | 2/2007 |
| CN | 202096154 U | 1/2012 |

(Continued)

OTHER PUBLICATIONS

European Patent Office, International Search Report, Written Opinion of the International Searching Authority for PCT/US2012/041477 mailed Sep. 8, 2012.
International Search Report for Taiwan Design Application No. 100306710D01 dated Dec. 6, 2013, 2 pages.

*Primary Examiner* — Michael Barr
*Assistant Examiner* — Caitlin N Dunlap
(74) *Attorney, Agent, or Firm* — Klintworth & Rozenblat IP LLC (57) ABSTRACT

A cleaning device for cleaning substrates is provided. The cleaning device includes a generally cylindrically-shaped brush mandrel and a cylindrical brush. The brush mandrel has a body section with an outer surface positioned about a central axis. The outer surface is interrupted by an engagement member having primary features adjacent secondary features. The brush has a hollow bore formed around the brush mandrel with an inner surface interrupted by a second engagement member which mates the first engagement member. The primary features flow in a direction generally perpendicular to a rotational direction of the brush mandrel around the central axis and include a first surface which is generally perpendicular to the outer surface. The secondary features include a second surface which flows in a direction generally perpendicular to the first surface and along the central axis. No primary feature includes a radially obstructing feature formed over any secondary feature.

8 Claims, 8 Drawing Sheets

(56) References Cited

U.S. PATENT DOCUMENTS

| | | | |
|---|---|---|---|
| 2001/0022008 A1 | 9/2001 | Dickey | |
| 2005/0091772 A1 | 5/2005 | McKay | |
| 2007/0006405 A1 | 1/2007 | Feng et al. | |
| 2007/0084004 A1* | 4/2007 | Shizawa et al. | 15/77 |
| 2010/0288305 A1* | 11/2010 | Kobetsky et al. | 134/6 |
| 2011/0088191 A1* | 4/2011 | Oohiro et al. | 15/230 |

FOREIGN PATENT DOCUMENTS

| | | |
|---|---|---|
| EP | 1107290 | 6/2001 |
| JP | 2009-33119 A | 2/2009 |
| WO | WO 2009147747 A1 * | 12/2009 |
| WO | 2011040701 | 4/2011 |

* cited by examiner

BRUSH MANDREL FOR PVA SPONGE BRUSH

CROSS-REFERENCES TO RELATED APPLICATIONS

The Present application is based on and claims the benefit of priority from U.S. Provisional Patent Application Ser. No. 61/494,786, entitled "BRUSH CORE FOR PVA SPONGE BRUSH" and filed on 8 Jun. 2011 with the United States Patent and Trademark Office, the contents of which are hereby incorporated by reference in their entirety to the extent permitted by law.

The Present application claims the benefit of priority from U.S. Design patent application Ser. No. 29/393,743 entitled "BRUSH CORE FOR SPONGE BRUSH", and filed on 8 Jun. 2011 with the United States Patent & Trademark Office, the contents of which are hereby incorporated by reference herein in their entirety to the extent permitted by law.

FIELD OF THE INVENTION

The present invention relates generally to processes and devices for cleaning articles. More specifically, it relates to a brush mandrel for retaining a brush used for cleaning semiconductor substrates.

BACKGROUND

Cast cylindrical polyvinyl alcohol brushes are conventionally used in automatic cleaning systems to provide a post CMP (Chemical Mechanical Planarization) process to effectively clean surfaces of substrates such as semiconductor wafers or other disc-shaped substrates. Cylindrical polyvinyl alcohol brushes are also used in cleaning systems to clean and dry glass and other non-disc-shaped substrates in flat panel display manufacture, glass production, and printed circuit board assembly. Cylindrical brushes preferably have a length as short as 50 millimeters or as long as 10 meters, for example.

The cylindrical brushes are located on and driven by a central brush mandrel in the cleaning process. An accurate and stable connection between the cylindrical brush and the central brush mandrel is desirable. The cylindrical brushes may have nodules on their outer surface to help clean the substrate.

The cylindrical brushes are expected to accurately rotate on their axis and provide a generally cylindrical surface with a generally consistent nodule pressure pattern over their useful life, which defines optimum cleaning of the entire substrate surface in the least amount of time with minimal damage to the substrate surface.

Figure 1A:
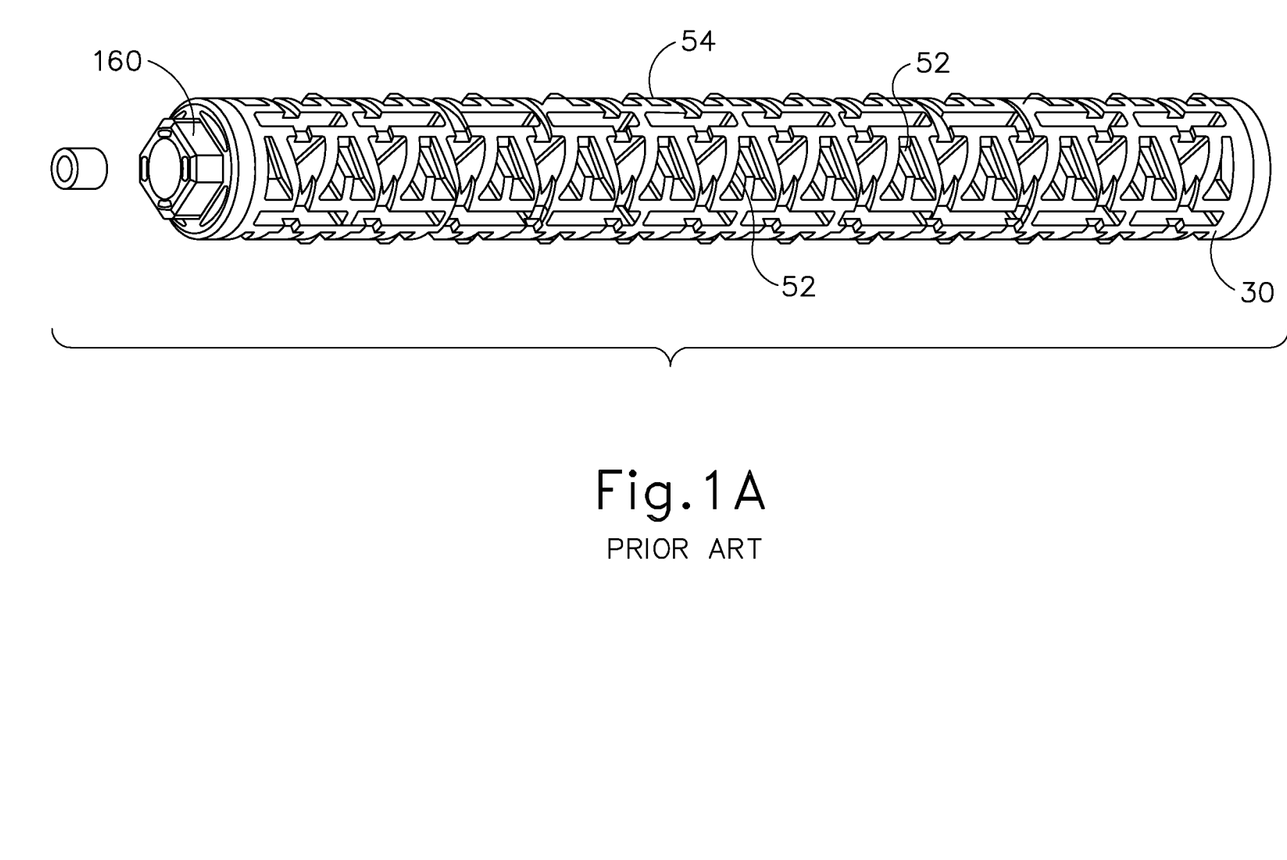
FIGS. 1A-1B depict various views of a previous brush and mandrel combination.
Figure 1B:
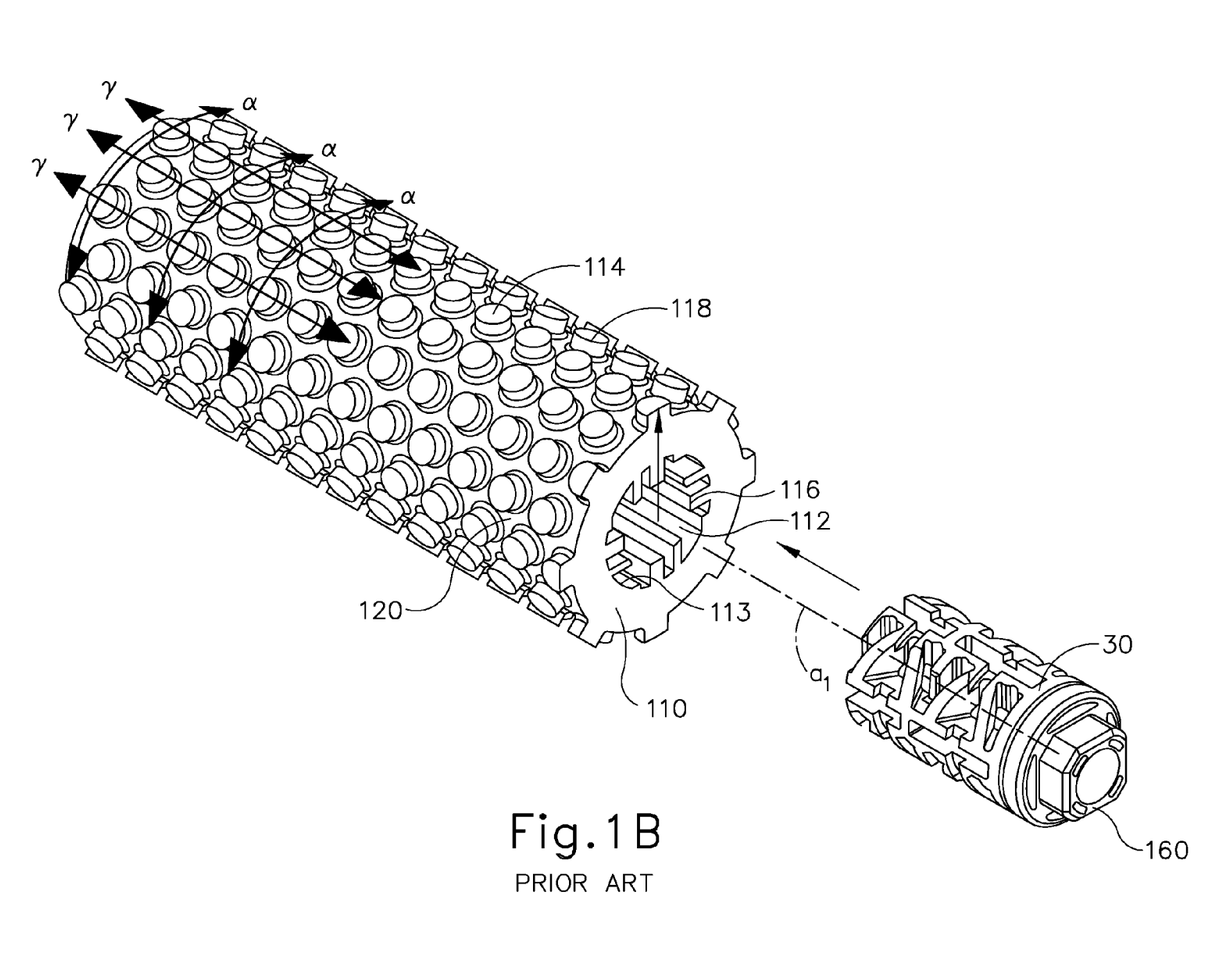

In some cases, the cylindrical brush is formed around the central brush mandrel. For example, the brush mandrel may be placed in a mold and a mixture of chemicals, such as polyvinyl alcohol, is injected into the mold to form the cylindrical brush around the central brush mandrel. With reference to FIGS. 1A and 1B, in previous brush mandrel designs, a brush mandrel 30 may include a plurality of odd shaped nooks, cracks, and crevices 52 formed on an outer surface 54 of the brush mandrel 30 to better engage and hold the cylindrical brush. As the cylindrical brush 110 is formed around the brush mandrel 30, gas bubbles may get trapped in the crevices 52 and either remain in the crevices 52 or rise and be trapped within the cylindrical brush 110 as the cylindrical brush 110 is forming. The trapped gas bubbles form defects in the cylindrical brush 110 which prevent the cylindrical brush 110 from performing as designed.

Additionally, at times, over the life of the cylindrical brush, there will typically be a tendency for the brush to move axially or rotationally by partially slipping on the brush mandrel and this is regarded as unsatisfactory performance. As a result, it would be desirable to have a brush mandrel which can provide an accurate and stable connection between the cylindrical brush and the central brush mandrel and which can prevent gas bubbles from forming or being trapped in the cylindrical brush.

SUMMARY

In one aspect, a cleaning device for cleaning substrates is provided. The cleaning device includes, but is not limited to, a generally cylindrically-shaped brush mandrel and a cylindrical brush. The brush mandrel has a body section with an outer surface positioned about a central axis. The outer surface is interrupted by a first engagement member having a primary feature adjacent a secondary feature. The cylindrical brush has a hollow bore formed around the brush mandrel. The hollow bore has an inner surface interrupted by a second engagement member which mates with and surrounds the first engagement member of the brush mandrel. The primary feature is a first surface which flows in a direction generally perpendicular to a rotational direction of the brush mandrel around the central axis in order to prevent rotational movement of the cylindrical brush with respect to the brush mandrel. The secondary feature is a second surface which flows in a direction generally perpendicular to the first surface and along the central axis. The second surface has a first portion which is closer to the central axis and a second portion which is further away from the central axis than the first portion in order to prevent axial movement of the cylindrical brush with respect to the brush mandrel.

In one aspect, a cleaning device for cleaning substrates is provided. The cleaning device includes, but is not limited to, a generally cylindrically-shaped brush mandrel and a cylindrical brush. The brush mandrel has a body section with an outer surface positioned symmetrically about a central axis. The outer surface is interrupted by an engagement member having primary features adjacent secondary features. The cylindrical brush has a hollow bore formed around the brush mandrel. The hollow bore has an inner surface interrupted by a second engagement member which mates with and surrounds the first engagement member of the brush mandrel. The primary features flow in a direction generally perpendicular to a rotational direction of the brush mandrel around the central axis and include a first surface which is generally perpendicular to the outer surface. The secondary features include a second surface which flows in a direction generally perpendicular to the first surface and along the central axis. No primary feature includes a radially obstructing feature formed over any secondary feature.

In one aspect, a method for cleaning substrates is provided. The method includes, but is not limited to, engaging a substrate with a cleaning device having a generally cylindrical brush with a hollow bore formed around a brush mandrel with an outer surface wrapped around a central axis. The outer surface is interrupted by a first engagement member having primary features adjacent secondary features. The cylindrical brush has a hollow bore formed around the brush mandrel. The hollow bore has an inner surface interrupted by a second engagement member which mates with and surrounds the first engagement member of the brush mandrel. The primary features flow in a direction generally perpendicular to a rotational direction of the brush mandrel around the central axis and include a first surface which is generally perpendicular to the outer surface. The secondary features include a second surface which flows in a direction generally perpendicular to the first surface and along the central axis. No primary feature includes a radially obstructing feature formed over any secondary feature.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

Methods and systems consistent with the present invention overcome the disadvantages of conventional brushes and brush-mandrel systems by reducing rotational and axial slippage of the brush and by minimizing the formation of unwanted gas bubbles in the brush. In particular, a cylindrical brush is formed around a brush mandrel having an outer surface interrupted by a first engagement member having primary and secondary features, whereby no primary feature includes a radially obstructing feature formed over any secondary feature, thereby preventing the trapping of any gas bubbles in first engagement member, or the brush, when forming the brush around the brush mandrel.

Figure 3:
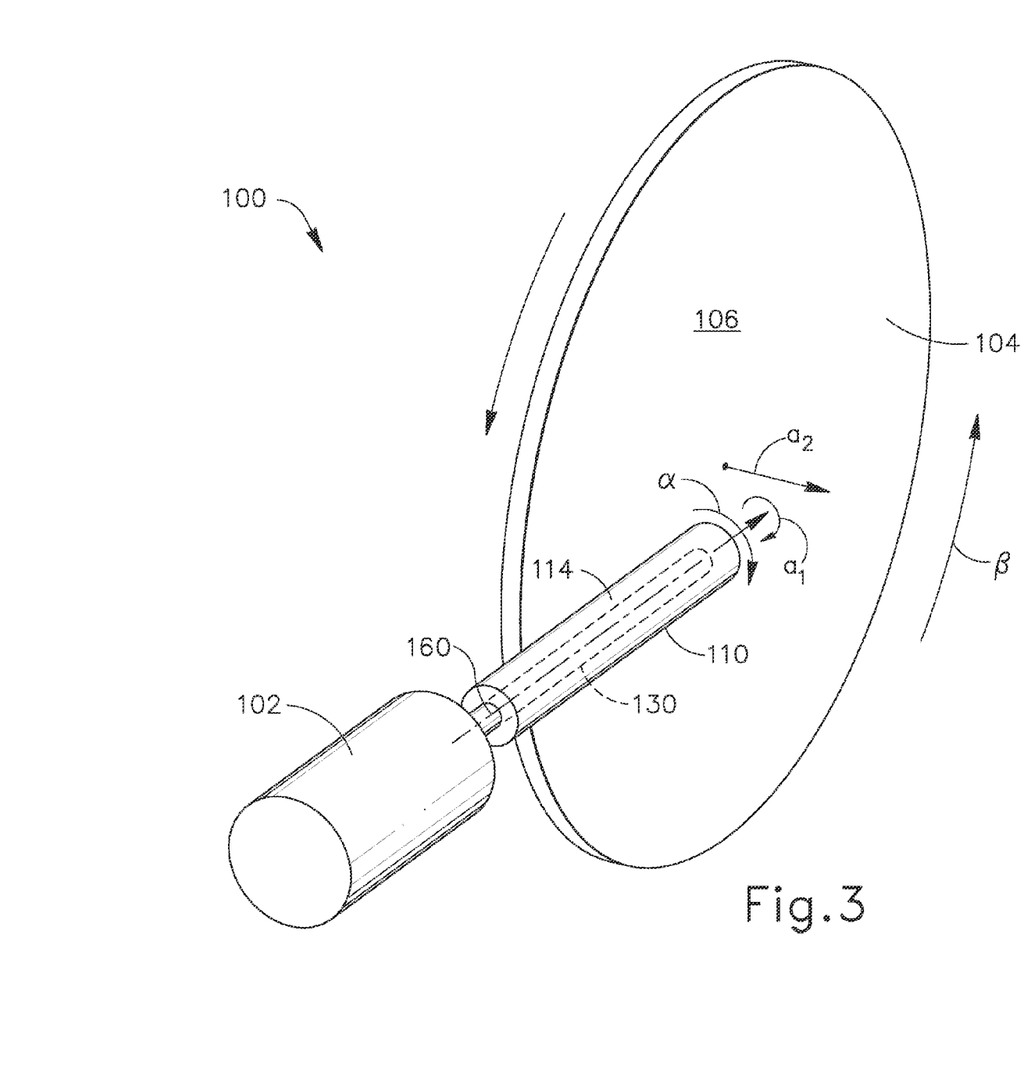
FIG. 3 depicts a perspective view of a cleaning system for cleaning and polishing substrates, in accordance with one embodiment of the present invention.

Referring to FIG. 3, there is shown a cleaning system 100 for cleaning and polishing substrates 104. Preferably, the cleaning system 100 is an automatic cleaning system which can automatically or manually be set to polish and/or clean a substrate 104, and more particularly a surface 106 of the substrate 104. Substrate 104 includes any one of a variety of disc-shaped or non-disc-shaped substrates, such as: silicon based substrates including glass, dry glass, semiconductor wafers, flat panel display glass panels, glass production panels, and printed circuit boards; polymer-based substrates; and various types of semiconductor substrates such as silicon-based semiconductor substrates, single element semiconductor substrates, silicon on insulator (SOI) substrates, III-V semiconductor substrates, II-VI semiconductor substrates, other binary semiconductor substrates, ternary semiconductor substrates, quaternary semiconductor substrates; fiber optic substrates; superconducting substrates; glass substrates; fused quartz substrates; fused silica substrates; epitaxial silicon substrates; and organic semiconductor substrates.

Referring to FIGS. 2A-2G and FIG. 3, cleaning system 100 includes a generally cylindrical brush 110 having a hollow bore 112, a brush mandrel 130 engaging the brush 110 within the hollow bore 112, and a rotational device 102 engaging the brush mandrel 130. The cylindrical brush 110 may be any brush which is or may be conventionally used in an automatic cleaning system to provide a post chemical mechanical planarization (CMP) process to effectively clean the surface 106 of substrate 104, such as a cast cylindrical polyvinyl alcohol (PVA) foam brush, a polyurethane foam brush, or other polymeric foam brush.

Figure 2A:
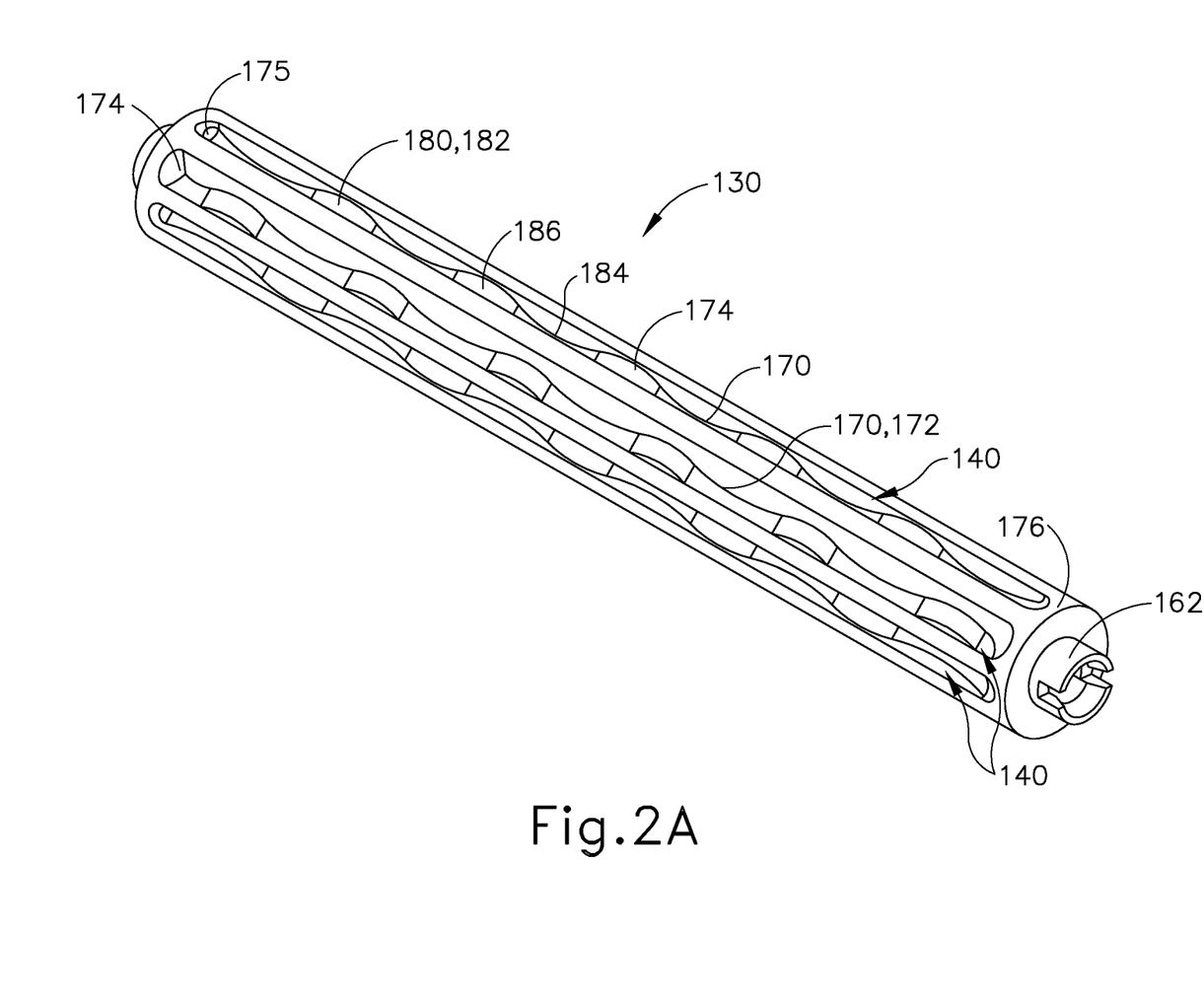
FIGS. 2A-2H depict various views of a brush and brush mandrel, in accordance with one embodiment of the present invention.
Figure 2B:
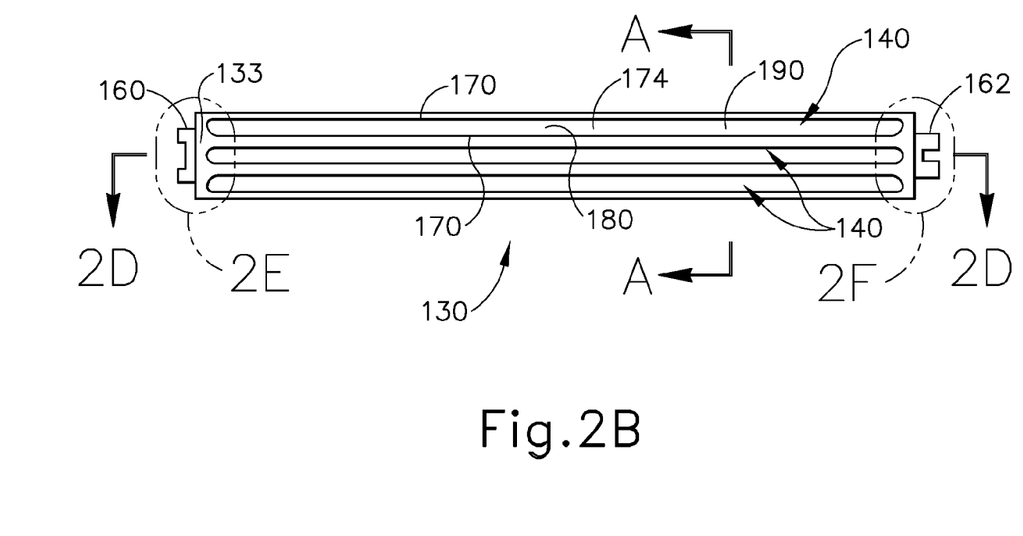
Figure 2C:
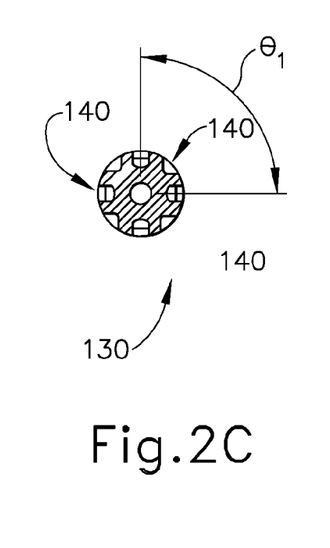
Figure 2D:
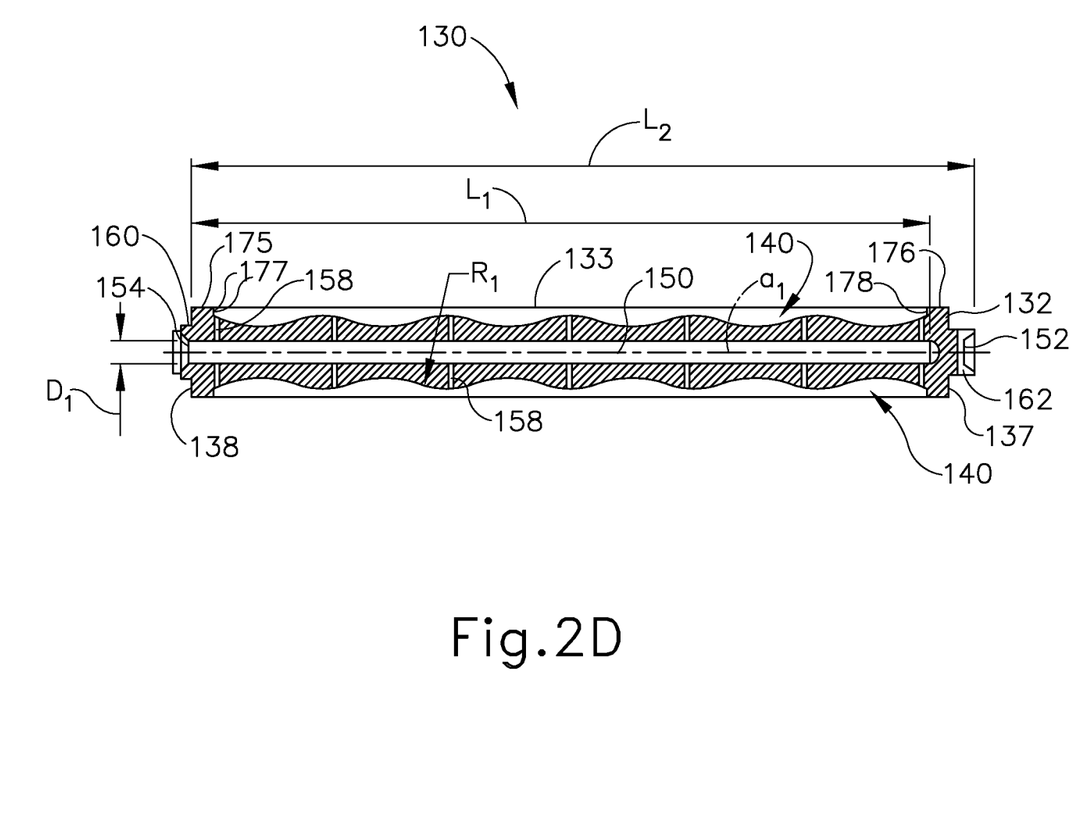
Figure 2E:
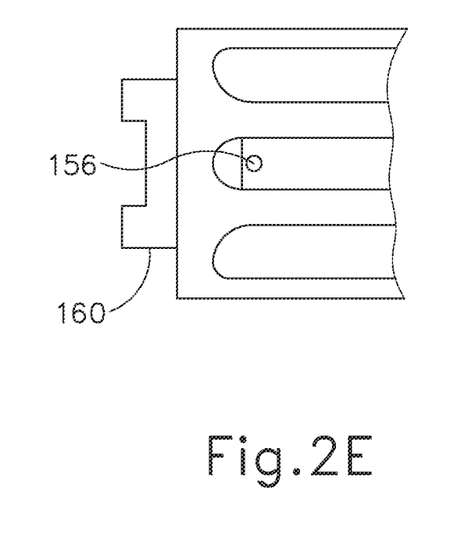
Figure 2F:
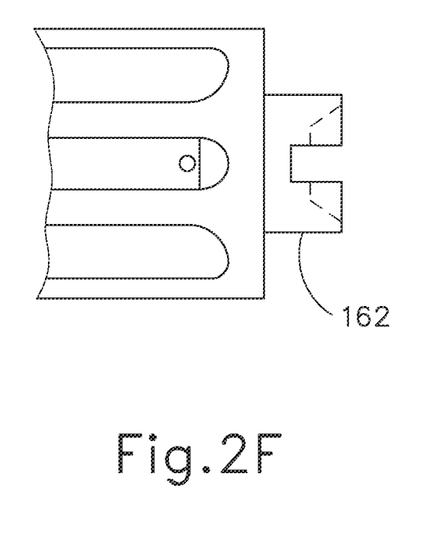
Figure 2G:
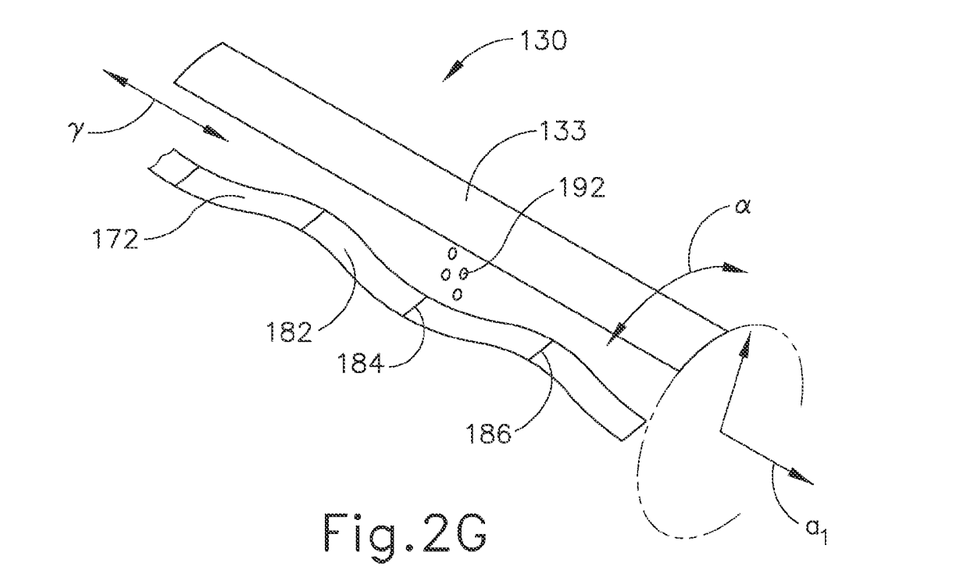
Figure 2H:
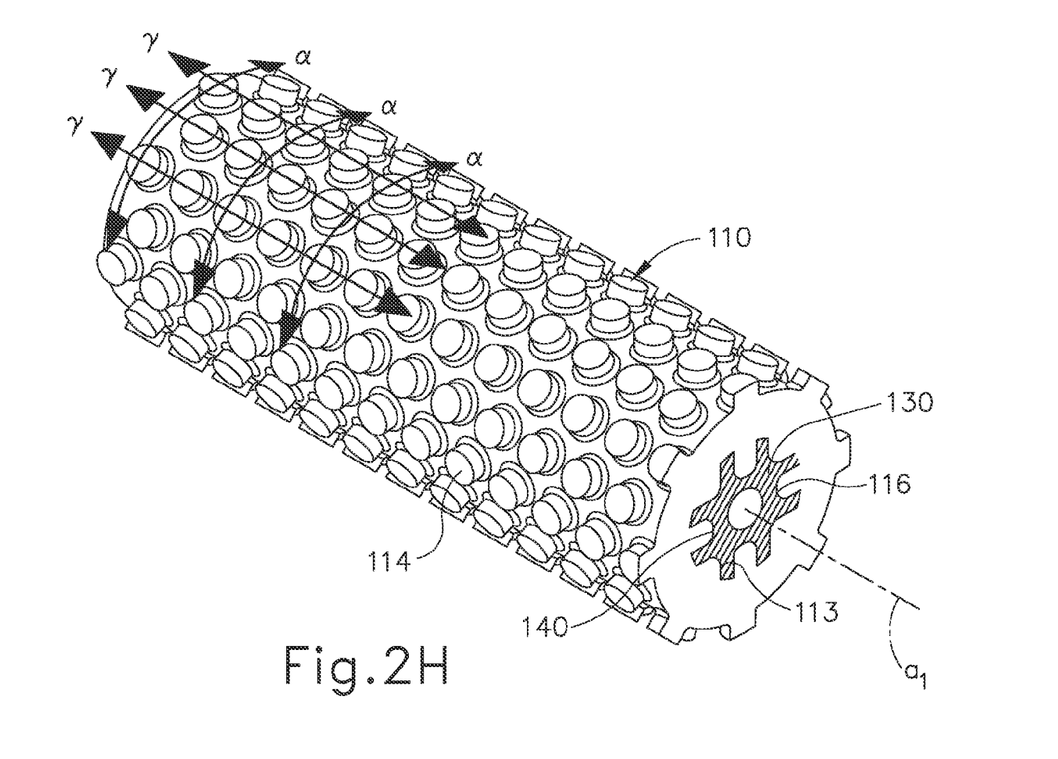

Referring to FIG. 2H, cylindrical brush 110 includes an outer cleaning surface 114 opposed to an inner surface 113, forming the hollow bore 112, and interrupted by a second engagement member 116. The hollow bore 112 is formed around the brush mandrel 130, preferably by injection molding the brush 110 around an already formed brush mandrel 130. The hollow bore 112 is defined by the inner surface 113 of the cylindrical brush 110. The inner surface 113 is interrupted by a second engagement member 116 which mates with and surrounds the first engagement member 140 of the brush mandrel 130, since the second engagement member 116 is formed around the first engagement member 140.

Second engagement member 116 defines the contour of hollow bore 112 and mates with and surrounds a first engagement member 140 of the brush mandrel 130. Referring to FIG. 2B, along a cross-section of second engagement member 116, along a line A-A which is perpendicular to a rotational axis $a_1$ of the brush mandrel 130, defines the contour of hollow bore 112. By forming the second engagement member 116 around the first engagement member 140, the brush 110 is securely fitted to the brush mandrel 130 in order to prevent slippage and movement between the brush mandrel 130 and the brush 110.

Outer cleaning surface 114 may be generally smooth, as shown in FIG. 3, or outer cleaning surface 114 may have nodules 118 with channels 120 formed between the nodules 118, as shown in FIG. 1B. Having nodules 118 with channels 120 may help brush 110 to better clean certain substrates 104. Surface features on the outer cleaning surface 114, such as channels 120, lines, edges, points, or other raised surfaces or nodules 118, may be incorporated and have a beneficial effect at increasing torque transmission levels but may be limited due to their effect on outer cleaning surface 114 geometry changes and also on the difficulty of forming the brush 110 on the brush mandrel 130.

Referring to FIG. 3 and FIGS. 2A-2G, the brush mandrel 130 engages the brush 110 within the hollow bore 112. The brush mandrel 130 includes a body section 132 which forms an outer surface 133 which engages and is secured to the inner surface 113 defining the hollow bore 112 of the brush 110.

Preferably, the brush mandrel 130 is generally cylindrically-shaped. As defined herein, a generally cylindrically-shaped member, such as the brush mandrel 130, is a member which is formed around a longitudinal central axis $a_1$, and which is preferably balanced around the central axis $a_1$ in such a way that the centrifugal forces generated by the member as the member rotates around the central axis $a_1$ vary by no more than ±20%, providing for a relatively balanced brush mandrel 130. As a result, the brush mandrel 130 does not have to have a perfectly cylindrical outer surface 133, but can have interruptions, such as first engagement members 140, in its outer surface 133.

With reference to FIG. 2D, preferably, the outer surface 133 is positioned about a central axis $a_1$ of the brush mandrel 130, and more preferably, the outer surface 133 is positioned symmetrically about a central axis $a_1$ of the brush mandrel 130. In order to prevent rotational movement, and preferably axial movement, between the brush 110 and the brush mandrel 130, the profile or contour of the outer surface 133 may be interrupted by a first engagement member 140. Rotational movement is defined herein as movement along a rotational direction α about the rotational axis $a_1$, as shown in FIG. 2H. Axial movement is defined herein as movement along an axial direction γ which is generally perpendicular to, within ±30° of, the rotational axis $a_1$. First engagement member 140 is any feature which interrupts the general contour of outer surface 133 in order to better engage the second engagement member 116 of the brush 110. First engagement member 140 includes such features as a band or a series of bands, a ridge or series of ridges, or a channel 174 or a series of channels 174 at any number of locations along the outer surface 133 to effectively axially secure the brush 110 to the brush mandrel 130, as shown in FIGS. 2A-2G and 3.

In one embodiment, the first engagement member includes a channel 174, or a series of channels 174 which extend along a length of the brush mandrel 130, in a direction which is preferably generally parallel to, within ±30°, of the rotational axis $a_1$ of the brush mandrel 130, as shown in FIGS. 2A and 2B. However, channels 174 may wrap around the brush mandrel 130 in a direction which is preferably generally perpendicular to, within ±30° of, the rotational axis $a_1$ of the brush mandrel 130 and generally parallel to, within ±30° of, the rotational direction a of the brush mandrel 130. In one embodiment, the channels 174 are wrapped around the brush mandrel 130 in a spiral pattern.

With reference to FIGS. 2A and 2G, preferably, the first engagement member 140 has a primary feature 170 adjacent a secondary feature 180. Preferably, the primary feature 170 includes a first surface 172 which flows in a direction generally perpendicular to, within ±30° of, the rotational direction a of the brush mandrel 130 around the central axis $a_1$ and from the outer surface 133 and in towards the central axis $a_1$, in order to prevent rotational movement of the cylindrical brush 110 with respect to the brush mandrel 130. Preferably, the first surface forms side walls of channel 174.

Preferably, the secondary feature 180 is a second surface 182 which flows in a direction generally perpendicular to, within ±30° of, the first surface 172 and along the central axis $a_1$. Preferably, the second surface 182 is also generally parallel to, within ±60° of, the outer surface 133. Preferably, the second surface 182 has a first portion 184 which is closer to the central axis $a_1$ and a second portion 186 which is further away from the central axis $a_1$ than the first portion 184 in order to prevent axial movement of the cylindrical brush 110 with respect to the brush mandrel 130. Preferably, there is a smooth transition between the first and second portions 184, 186, with preferably, no sharp edges or corners, in order to prevent the trapping of gas bubbles 192 in the channel 174, or the brush 110, when forming the cylindrical brush 110 around the brush mandrel 130. Preferably, the smooth transition is a series of curved hills and valleys, as shown in FIG. 2A.

Preferably, the channel 174 starts at a first end 175 and ending at a second end 176, and the secondary feature 180 is a curved surface 182 at the bottom of the channel 174 having a first curved taper 177 at the first end 175 of the channel 174 and a second curved taper 178 at the second end 176 of the channel 174. The first and second tapers 177, 178 along with the curved surface 182, help to prevent the trapping of gas bubbles 192 in the channel 174, or the brush 110, when forming the cylindrical brush 110 around the brush mandrel 130, since there are less sharp edges or corners for the gas bubbles 192 to get trapped in or on.

Preferably, the primary feature 170, and preferably the first surface 172, which preferably surrounds and is adjacent to the secondary feature 180, includes no radially obstructing features formed over the secondary feature 180. A radially obstructing feature is any feature formed over the secondary feature 180, that when drawing a straight line from a point on the surface 182 of the secondary feature 180 and through an opening 190 formed at the outer surface 133, that the straight line does not pass through or touch any part of the primary feature 170. In this manner, no portion of the primary feature 170 would obstruct or prevent a gas bubble 192 from exiting the in the channel 174 when forming the cylindrical brush 110 around the brush mandrel 130.

With reference to FIGS. 2D and 2E, preferably, pores 156 are formed from the outer surface 133 of the body section 132 to a fluid channel 150 for flowing polishing fluid from the fluid channel 150 to the outer surface 133 of the body section 132 and to the brush 110 through channels 158.

As a result of first and second engagement members 140, 116, the physical fit between the outer surface 133 of the brush mandrel 130 and the inner surface 113 of the brush 110 provides significant resistance to slipping. This resistance to slipping could be further enhanced by other methods including adhesives, surface preparation of the mandrel (chemical, physical, corona, and the like), or such additional surface features as knurls, sharp edges, hooks, points, keys, or other linking features.

Referring to FIGS. 2E, 2F, and 3, in one embodiment the brush mandrel 130 also includes rotational engagement members 160, 162 for engaging and connecting with a rotational device 102. The rotational engagement members 160, 162 are any device which can be used to connect with or fasten to another device, and includes things such as a nut-shaped piece that is integrally formed with the brush mandrel 130 and can be fastened to the rotational device 102. The rotational device 102 includes any device which can induce a rotational movement onto the brush mandrel 130, such as an electrical motor, a gas motor or engine, a crank shaft power by a motor or manually powered, and any combination of pulleys, wheels, mechanical linkages, and/or gears moved automatically or manually. The rotational device 102 has a complimentary engagement member which connects with the rotational engagement members 160, 162 for engaging and connecting the brush mandrel 130 with the rotational device 102.

In operation, the brush 110 is formed around the brush mandrel 130, preferably by injection molding the brush 110 around the brush mandrel 130. Upon forming the brush 110 around the brush mandrel 130, the brush mandrel 130 and the brush 110 are then connected with the rotational device 102 by connecting the rotational engagement member 160 with an engagement member on connecting with the rotational device 102. Then, the brush 110 is rotated along the rotational direction a about the rotational axis $a_1$. While rotating the brush 110, or before rotating the brush 110, the brush 110 is placed near and engages the surface 106 of the substrate 104. The rotational motion of the brush 110 on the surface 106 helps to clean and/or polish the surface 106. Referring to FIG. 3, in one embodiment, the substrate 104 is also rotated along a rotational direction β about a rotational axis $a_2$. In one embodiment, polishing fluid is pumped through fluid channel 150 formed in the body section 132 and into the brush 110 through pores 156 formed through the outer surface 133 of the body section 132 and to the fluid channel 150. The polishing fluid helps to further clean and/or polish the substrate 104.

Although the illustrative examples above describe cylindrical PVA brushes 110 used to clean semiconductor substrates 104, one having skill in the art will appreciate that methods and systems consistent with the present invention are not limited thereto. For example, the brush 110 may include other materials and may be used to clean other types of surfaces 106 or substrates 104. Further, the brush 110 is not limited to having a cylindrical shape, but may have any shape or configuration.

The Abstract of the Disclosure is provided to allow the reader to quickly ascertain the nature of the technical disclosure. It is submitted with the understanding that it will not be used to interpret or limit the scope or meaning of the claims.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While various embodiments of the invention have been described, it will be apparent to those of ordinary skill in the art that other embodiments and implementations are possible within the scope of the invention. Accordingly, the invention is not to be restricted except in light of the attached claims and their equivalents.

The invention claimed is:

1. A cleaning device for cleaning substrates, the device comprising:
   a generally cylindrically-shaped brush mandrel having a body section with an outer surface positioned about a central axis, wherein the outer surface is interrupted by a first engagement member having a primary feature adjacent a secondary feature; and
   a cylindrical brush having a hollow bore formed around the brush mandrel, the hollow bore having an inner surface interrupted by a second engagement member which mates with and surrounds the first engagement member of the brush mandrel,
   wherein the primary feature is a first surface which flows in a direction generally perpendicular to a rotational direction of the brush mandrel around the central axis in order to prevent rotational movement of the cylindrical brush with respect to the brush mandrel, wherein the secondary feature is a second surface which flows in a direction generally perpendicular to the first surface and along the central axis, and wherein the second surface has a first portion which is closer to the central axis and a second portion which is further away from the central axis than the first portion in order to prevent axial movement of the cylindrical brush with respect to the brush mandrel, and
   wherein the primary feature is a channel starting at a first end and ending at a second end, and wherein the secondary feature is a curved surface at the bottom of the channel having a first curved taper at the first end of the channel and a second curved taper at the second end of the channel.

2. The cleaning device of claim 1, wherein the body section forms a fluid channel for receiving fluid along the central axis of the body section, and wherein the body section forms a pore from the outer surface of the body section to the fluid channel for flowing fluid from the fluid channel to the outer surface of the body section.

3. The cleaning device of claim 1 further comprising a rotational engagement member connected with the brush mandrel for engaging a rotational device.

4. The cleaning device of claim 1, wherein the cylindrical brush has a plurality of nodules on an outer surface of the cylindrical brush.

5. A cleaning device for cleaning substrates, the device comprising:
   a generally cylindrically-shaped brush mandrel having a body section with an outer surface positioned symmetrically about a central axis, wherein the outer surface is interrupted by a first engagement member having primary features adjacent secondary features; and
   a cylindrical brush having a hollow bore formed around the brush mandrel, the hollow bore having an inner surface interrupted by a second engagement member which mates with and surrounds the first engagement member of the brush mandrel,
   wherein the primary features flow in a direction generally perpendicular to a rotational direction of the brush mandrel around the central axis and include a first surface which is generally perpendicular to the outer surface, wherein the secondary features include a second surface which flows in a direction generally perpendicular to the first surface and along the central axis, and wherein no primary feature includes a radially obstructing feature formed over any secondary feature,
   wherein the second surface has a first portion which is closer to the central axis and a second portion which is further away from the central axis than the first portions in order to prevent axial movement of the cylindrical brush with respect to the brush mandrel, and
   wherein the primary feature is a channel starting at a first end and ending at a second end, and wherein the secondary feature is a curved surface at the bottom of the channel having a first curved taper at the first end of the channel and a second curved taper at the second end of the channel.

6. The cleaning device of claim 5, wherein the body section forms a fluid channel for receiving fluid along the central axis of the body section, and wherein the body section forms a pore from the outer surface of the body section to the fluid channel for flowing fluid from the fluid channel to the outer surface of the body section.

7. The cleaning device of claim 5 further comprising a rotational engagement member connected with the brush mandrel for engaging a rotational device.

8. The cleaning device of claim 5, wherein the cylindrical brush has a plurality of nodules on an outer surface of the cylindrical brush.

* * * * *